United States Patent
Harada

(10) Patent No.: US 12,359,986 B2
(45) Date of Patent: Jul. 15, 2025

(54) SENSOR

(71) Applicant: Murata Manufacturing Co., Ltd., Nagaokakyo (JP)

(72) Inventor: Shingo Harada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/790,325

(22) Filed: Jul. 31, 2024

(65) Prior Publication Data

US 2024/0385060 A1 Nov. 21, 2024

Related U.S. Application Data

(63) Continuation of application No. PCT/JP2023/004159, filed on Feb. 8, 2023.

(30) Foreign Application Priority Data

Feb. 10, 2022 (JP) ................. 2022-019250

(51) Int. Cl.
*G01L 1/16* (2006.01)
*G06F 3/01* (2006.01)
*H10N 30/30* (2023.01)

(52) U.S. Cl.
CPC ............. *G01L 1/16* (2013.01); *G06F 3/01* (2013.01); *H10N 30/302* (2023.02)

(58) Field of Classification Search
CPC ........... G01L 1/16; G06F 3/01; H10N 30/302; H10N 30/87
See application file for complete search history.

(56) References Cited

U.S. PATENT DOCUMENTS

| | | | |
|---|---|---|---|
| 2012/0086311 A1* | 4/2012 | Aoki | G01P 15/09 29/25.35 |
| 2015/0101731 A1* | 4/2015 | Hepp | H10N 30/302 156/64 |
| 2016/0153860 A1* | 6/2016 | Kamiya | G01P 15/09 73/753 |
| 2018/0071466 A1* | 3/2018 | White | A44C 5/003 |
| 2020/0141794 A1 | 5/2020 | Hiyama et al. | |

FOREIGN PATENT DOCUMENTS

| | | |
|---|---|---|
| JP | H0875575 A | 3/1996 |
| JP | 2015-034818 A | 2/2015 |
| JP | 2019-010497 A | 1/2019 |
| WO | 2020/129346 A1 | 6/2020 |
| WO | 2021/261548 A1 | 12/2021 |

OTHER PUBLICATIONS

International Search Report received for PCT Patent Application No. PCT/JP2023/004159, mailed on Mar. 14, 2023, 2 pages (English Translation Only).

\* cited by examiner

*Primary Examiner* — Pegeman Karimi
(74) *Attorney, Agent, or Firm* — ArentFox Schiff LLP

(57) ABSTRACT

A sensor that includes: a piezoelectric film; a first electrode arranged above the piezoelectric film, and overlapping at least a part of the piezoelectric film; a second electrode arranged below the piezoelectric film, and overlapping at least a part of the piezoelectric film; and an insulator layer arranged above the first electrode, and overlapping at least a part of the first electrode, in which at least a part of an outer edge of the insulator layer does not overlap the first electrode, and is located below an upper principal surface of the first electrode.

16 Claims, 4 Drawing Sheets

SENSOR

CROSS REFERENCE TO RELATED APPLICATIONS

The present application is a continuation of International application No. PCT/JP2023/004159, filed Feb. 8, 2023, which claims priority to Japanese Patent Application No. 2022-019250, filed Feb. 10, 2022, the entire contents of each of which are incorporated herein by reference.

TECHNICAL FIELD

The present disclosure relates to a sensor that detects a pressing force.

BACKGROUND ART

As an disclosure related to a conventional sensor, for example, a pressing sensor described in Patent Document 1 is known. The pressing sensor includes a piezoelectric film, a second electrode, and a third electrode. The second electrode is fixed to an upper principal surface of the piezoelectric film with a bonding layer interposed therebetween. The third electrode is fixed to a lower principal surface of the piezoelectric film with a bonding layer interposed therebetween. When pressed downward, the piezoelectric film extends in a left-right direction. When the piezoelectric film is stretched in the left-right direction, charges are generated. As a result, a detection signal according to a pressing force is output from the second electrode. The pressing sensor as described above is attached to a display panel of an electronic device.

Patent Document 1: WO 2020/129346 A

SUMMARY OF THE DISCLOSURE

By the way, in the pressing sensor described in Patent Document 1, it is desired to improve the sealing property of the electrode.

Therefore, an object of the present disclosure is to provide a sensor capable of improving the sealing property of an electrode.

A sensor according to an embodiment of the present disclosure includes: a piezoelectric film including an upper principal surface and a lower principal surface aligned in an up-down direction; a first electrode including an upper principal surface and a lower principal surface aligned in the up-down direction, arranged above the piezoelectric film, and overlapping at least a part of the piezoelectric film as viewed in the up-down direction; a second electrode including an upper principal surface and a lower principal surface aligned in the up-down direction, arranged below the piezoelectric film, and overlapping at least a part of the piezoelectric film as viewed in the up-down direction; and an insulator layer including an upper principal surface and a lower principal surface aligned in the up-down direction, arranged above the first electrode, and overlapping at least a part of the first electrode as viewed in the up-down direction, in which at least a part of an outer edge of the upper principal surface of the insulator layer as viewed in the up-down direction does not overlap the first electrode as viewed in the up-down direction, and is located below the upper principal surface of the first electrode as viewed in the up-down direction.

According to the sensor of the present disclosure, the sealing property of the electrode can be improved.

BRIEF EXPLANATION OF THE DRAWINGS

FIG. 4 is a sectional view of a sensor 6a.

DESCRIPTION OF THE PREFERRED EMBODIMENTS

Embodiment

[Structure of Electronic Device]

Figure 1:
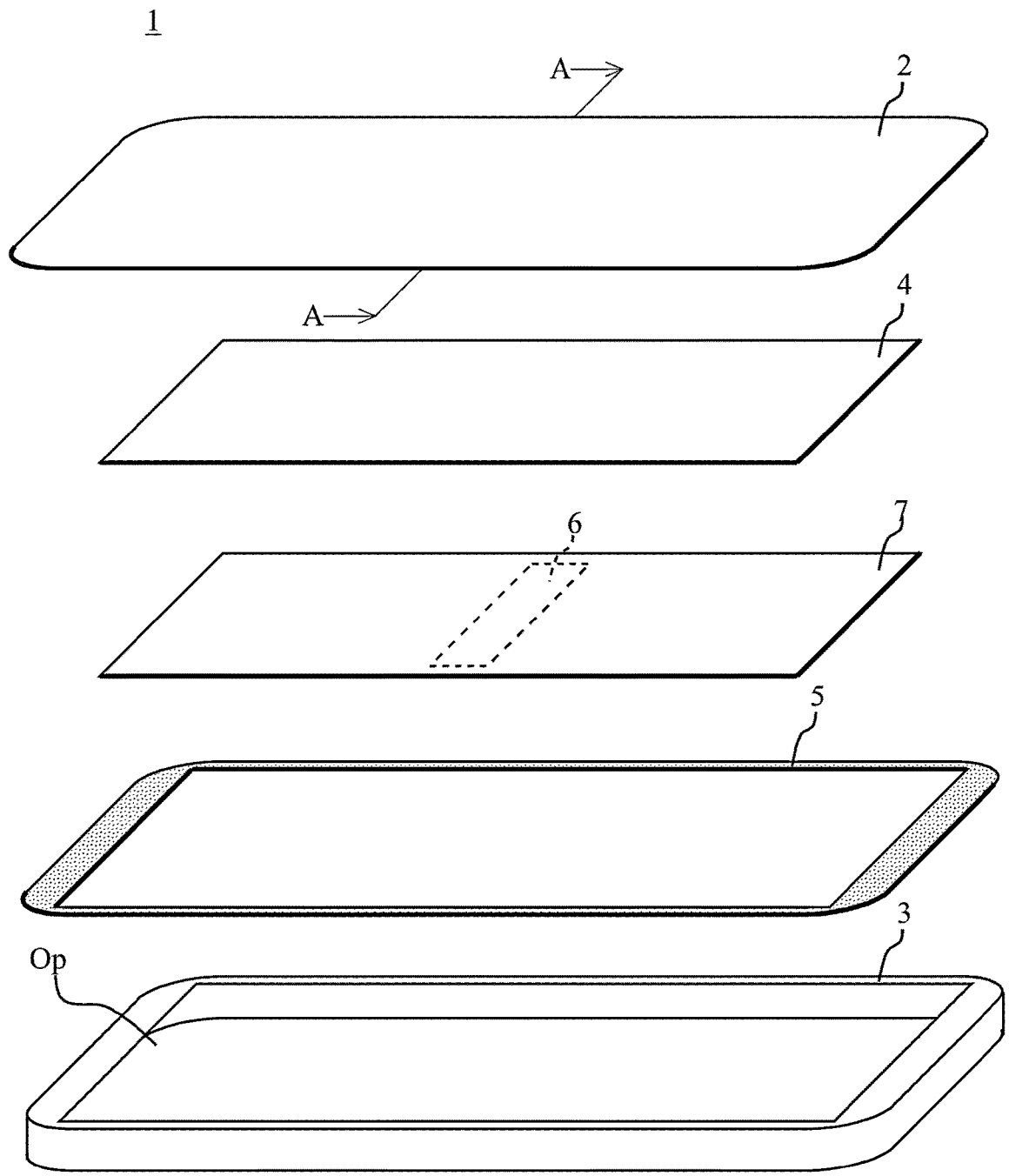
FIG. 1 is an exploded perspective view of an electronic device 1.
Figure 1:
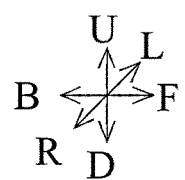
Figure 2:
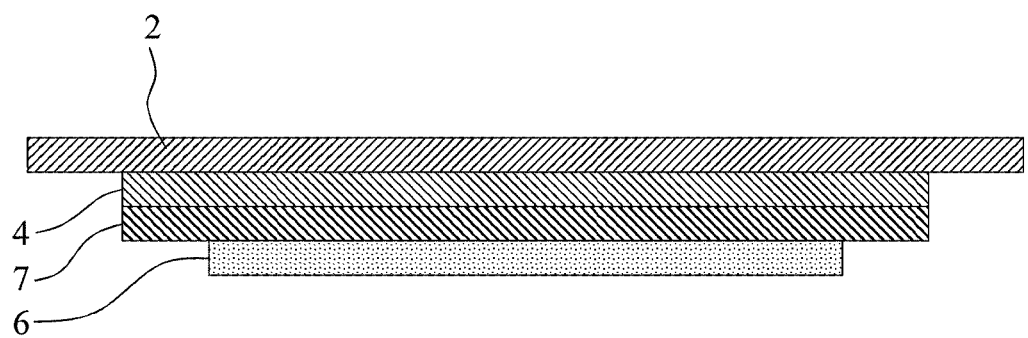
FIG. 2 is a sectional view of the electronic device 1 taken along line A-A.
Figure 2:
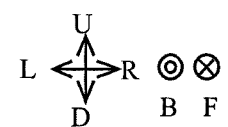
Figure 3:
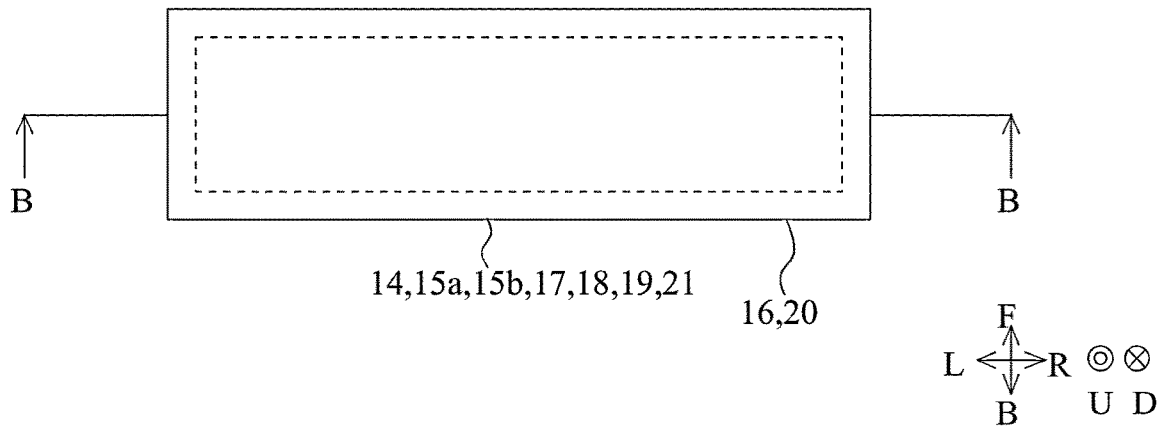
FIG. 3 is a bottom view and a sectional view of a sensor 6.
Figure 3:
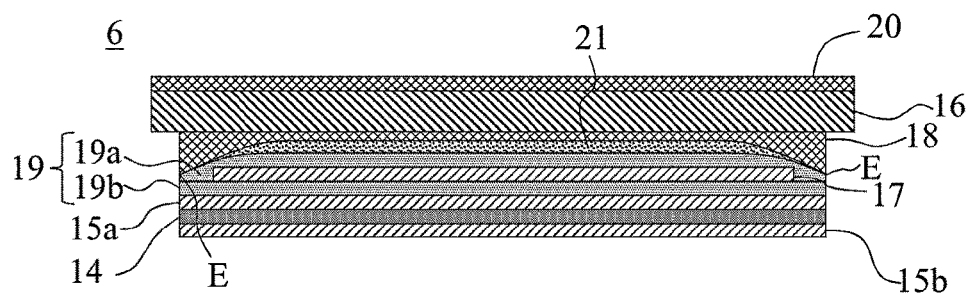
Figure 3:
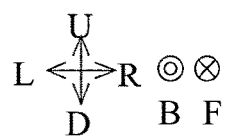

Hereinafter, a configuration of an electronic device 1 including a sensor 6 according to an embodiment of the present disclosure will be described with reference to the drawings. FIG. 1 is an exploded perspective view of the electronic device 1. FIG. 2 is a sectional view of the electronic device 1 taken along line A-A. FIG. 3 is a bottom view and a sectional view of the sensor 6.

Furthermore, in the present description, directions are defined as described below. In the electronic device 1, a direction in which an upper principal surface and a lower principal surface of an operation panel 2 are aligned is defined as an up-down direction. Furthermore, as viewed in the up-down direction, a direction in which a long side of the operation panel 2 of the electronic device 1 extends is defined as a front-back direction. As viewed in the up-down direction, a direction in which a short side of the operation panel 2 of the electronic device 1 extends is defined as a left-right direction. The up-down direction, the left-right direction, and the front-back direction are orthogonal to each other. Note that the definition of the directions in the present description is an example. Therefore, the directions at the time of actual use of the electronic device 1 do not need to coincide with the directions as defined herein. Furthermore, the up-down direction may be reversed in FIG. 1. In FIG. 1, the left-right direction may be reversed. In FIG. 1, the front-back direction may be reversed.

The electronic device 1 is a portable electronic terminal such as a smartphone or a tablet computer. As illustrated in FIGS. 1 and 2, the electronic device 1 includes the operation panel 2, a housing 3, a display panel 4, a bonding member 5, the sensor 6, and a plate-shaped member 7.

The operation panel 2 includes an upper principal surface and a lower principal surface aligned in the up-down direction. The operation panel 2 has a rectangular shape having two long sides extending in the front-back direction and two short sides extending in the left-right direction as viewed in the up-down direction. A part of a user's body or an operation member comes into contact with the upper principal surface of the operation panel 2. The operation panel 2 is a transparent plate. The operation panel 2 is, for example, a glass plate.

The display panel 4 includes an upper principal surface and a lower principal surface aligned in the up-down direction. The display panel 4 has a rectangular shape having two long sides extending in the front-back direction and two short sides extending in the left-right direction as viewed in the up-down direction. The display panel 4 is fixed to the lower principal surface of the operation panel 2. The display panel 4 is fixed to the operation panel 2 with a bonding adhesive, a double-sided tape, or the like. The entire display panel 4 overlaps the operation panel 2 as viewed in the up-down direction. Therefore, the display panel 4 does not protrude from an outer edge of the operation panel 2 as viewed in the up-down direction. The display panel 4 is, for example, an organic EL display or a liquid crystal display. Furthermore, the display panel 4 may include a touch panel for detecting a position where the user touches the operation panel 2. However, the touch panel may be included in the operation panel 2.

The plate-shaped member 7 includes an upper principal surface and a lower principal surface aligned in the up-down direction. The plate-shaped member 7 has a rectangular shape having two long sides extending in the front-back direction and two short sides extending in the left-right direction as viewed in the up-down direction. The plate-shaped member 7 is fixed to the lower principal surface of the display panel 4. The plate-shaped member 7 is fixed to the display panel 4 with a bonding adhesive, a double-sided tape, or the like. The entire plate-shaped member 7 overlaps the display panel 4 as viewed in the up-down direction. Therefore, the plate-shaped member 7 does not protrude from an outer edge of the display panel 4 as viewed in the up-down direction. The rigidity of the plate-shaped member 7 is higher than the rigidity of the sensor 6 described later. The material of such a plate-shaped member 7 is, for example, metal such as stainless used steel (SUS). However, the material of the plate-shaped member 7 may be a material other than metal. The material other than the metal is, for example, a resin.

The housing 3 is located below the operation panel 2. The housing 3 is a box. The housing 3 has a rectangular shape as viewed in the up-down direction. A long side of the housing 3 extends in the front-back direction. A short side of the housing 3 extends in the left-right direction. An outer edge of the housing 3 viewed in the up-down direction coincides with the outer edge of the operation panel 2 viewed in the up-down direction. However, an upper surface of the housing 3 is open. An opening Op of the housing 3 has a rectangular shape as viewed in the up-down direction.

The bonding member 5 fixes a part of the lower principal surface of the operation panel 2 to the housing 3. More specifically, the bonding member 5 fixes a periphery of the opening Op of the housing 3 and a vicinity of the outer edge of the operation panel 2. Therefore, the bonding member 5 has a rectangular frame shape surrounding the display panel 4 as viewed in the up-down direction. Therefore, the bonding member 5 does not overlap the display panel 4 as viewed in the up-down direction. The bonding member 5 as described above has waterproofness.

The sensor 6 detects deformation of the operation panel 2. As illustrated in FIG. 1, the sensor 6 is fixed to the lower principal surface of the plate-shaped member 7. More specifically, the sensor 6 has a rectangular shape as viewed in the up-down direction. The sensor 6 has a longitudinal direction extending in the left-right direction. The sensor 6 is located at a center of the plate-shaped member 7 in the front-back direction as viewed in the up-down direction.

When the user presses the operation panel 2 to bend the operation panel 2 downward, the display panel 4 and the plate-shaped member 7 also bend downward. Then, the sensor 6 bends downward together with the plate-shaped member 7. As a result, the sensor 6 outputs a detection signal according to deformation generated on the operation panel 2 when the user presses the operation panel 2. Hereinafter, details of the sensor 6 will be described with reference to FIG. 3.

As illustrated in FIG. 3, the sensor 6 includes a piezoelectric film 14, a third electrode 15a, a second electrode 15b, a substrate 16, a flexible printed circuit board 19, bonding layers 18 and 20, and an insulator layer 21. The piezoelectric film 14 has a sheet shape. Therefore, the piezoelectric film 14 includes an upper principal surface and a lower principal surface aligned in the up-down direction. A length of the piezoelectric film 14 in the left-right direction is longer than a length of the piezoelectric film 14 in the front-back direction. In the present embodiment, the piezoelectric film 14 has a rectangular shape having long sides extending in the left-right direction as viewed in the up-down direction. The piezoelectric film 14 generates a charge according to a deformation amount of the piezoelectric film 14. In the present embodiment, the piezoelectric film 14 is a PLA film. Hereinafter, the piezoelectric film 14 will be described in more detail.

The piezoelectric film 14 has a characteristic in which a polarity of the charge generated when the piezoelectric film 14 is stretched in the left-right direction is opposite to a polarity of the charge generated when the piezoelectric film 14 is stretched in the front-back direction. Specifically, the piezoelectric film 14 is a film formed of a chiral polymer. The chiral polymer is, for example, polylactic acid (PLA), particularly poly-L-lactic acid (PLLA). PLLA, which is a chiral polymer, has a main chain with a helical structure. PLLA has piezoelectricity in which molecules are oriented when uniaxial stretching is performed. The piezoelectric film 14 has a piezoelectric constant of d14. The uniaxial stretching direction (orientation direction) of the piezoelectric film 14 forms an angle of 45 degrees with respect to each of the front-back direction and the left-right direction. This angle of 45 degrees includes, for example, angles ranging from 45 degrees plus 10 degrees to 45 degrees minus 10 degrees. As a result, the piezoelectric film 14 generates a charge when the piezoelectric film 14 is stretched in the left-right direction or stretched in the front-back direction. A polarity of the charge generated by the piezoelectric film 14 when the piezoelectric film 14 is stretched in the left-right direction is different from a polarity of the charge generated by the piezoelectric film 14 when the piezoelectric film 14 is stretched in the front-back direction. The piezoelectric film 14 generates a positive charge when stretched in the left-right direction, for example. The piezoelectric film 14 generates a negative charge when stretched in the front-back direction, for example. A magnitude of the charge depends on an amount of deformation of the piezoelectric film 14 due to stretching or compression. More precisely, the magnitude of the charge is proportional to a differential value of a deformation amount of the piezoelectric film 14 due to stretching or compression.

The third electrode 15a is a signal electrode. Therefore, a detection signal is output from the third electrode 15a. The third electrode 15a includes an upper principal surface and a lower principal surface aligned in the up-down direction. The third electrode 15a is provided above the piezoelectric film 14 and below a first electrode 17 (details will be described later). In the present embodiment, the third electrode 15a is provided on the upper principal surface of the piezoelectric film 14. The third electrode 15a overlaps at least a part of the piezoelectric film 14 as viewed in the up-down direction. In the present embodiment, the third electrode 15a covers the entire upper principal surface of the piezoelectric film 14. The third electrode 15a includes an adhesive layer (not illustrated). The third electrode 15a is fixed to the upper principal surface of the piezoelectric film 14 by the adhesive layer.

The second electrode 15b is a ground electrode. The second electrode 15b is connected to a ground potential. The second electrode 15b includes an upper principal surface and a lower principal surface aligned in the up-down direction. The second electrode 15b is provided below the piezoelectric film 14. The second electrode 15b is provided on the lower principal surface of the piezoelectric film 14. The second electrode 15b overlaps at least a part of the piezoelectric film 14 as viewed in the up-down direction. In the present embodiment, the second electrode 15b covers the entire lower principal surface of the piezoelectric film 14. The second electrode 15b includes an adhesive layer (not illustrated). The second electrode 15b is fixed to the lower principal surface of the piezoelectric film 14 by the adhesive layer.

The flexible printed circuit board 19 includes an upper principal surface and a lower principal surface aligned in the up-down direction. The flexible printed circuit board 19 is provided above the third electrode 15a. The flexible printed circuit board 19 overlaps the third electrode 15a as viewed in the up-down direction.

The flexible printed circuit board 19 includes a first electrode 17 and flexible layers 19a and 19b. The flexible layers 19a and 19b are stacked in this order from the top to the bottom. The flexible layers 19a and 19b are made of an insulating material such as resin.

The first electrode 17 is a ground electrode. The first electrode 17 is connected to a ground potential. The first electrode 17 includes an upper principal surface and a lower principal surface aligned in the up-down direction. The first electrode 17 is provided above the piezoelectric film 14. In the present embodiment, the first electrode 17 is provided between the flexible layer 19a and the flexible layer 19b. The first electrode 17 overlaps at least a part of the piezoelectric film 14 as viewed in the up-down direction. In the present embodiment, the first electrode 17 is accommodated within an outer edge of the piezoelectric film 14 as viewed in the up-down direction.

The insulator layer 21 is a resist layer that is a protective layer. The insulator layer 21 includes an upper principal surface and a lower principal surface aligned in the up-down direction. The insulator layer 21 is provided above the first electrode 17. In the present embodiment, the insulator layer 21 is provided on the upper principal surface of the flexible printed circuit board 19. The insulator layer 21 overlaps at least a part of the first electrode 17 as viewed in the up-down direction. In the present embodiment, the insulator layer 21 overlaps the entire first electrode 17 as viewed in the up-down direction. At least a part of an outer edge E of the upper principal surface of the insulator layer 21 as viewed in the up-down direction does not overlap the first electrode 17 as viewed in the up-down direction, and is located below the upper principal surface of the first electrode 17. In the present embodiment, the entire outer edge E of the upper principal surface of the insulator layer 21 as viewed in the up-down direction does not overlap the first electrode 17 as viewed in the up-down direction, and is located below the upper principal surface of the first electrode 17. A position of the outer edge E of the upper principal surface of the insulator layer 21 in the up-down direction as viewed in the up-down direction is the same as a position of the first electrode 17 in the up-down direction. Note that the upper principal surface of the insulator layer 21 in the present specification is a portion having a normal line including a component in an upward direction in a surface of the insulator layer 21. The material of the insulator layer 21 as described above is, for example, polyimide.

The substrate 16 is provided on the insulator layer 21. The substrate 16 is deformed together with the piezoelectric film 14 by holding the piezoelectric film 14, the third electrode 15a, the second electrode 15b, the flexible printed circuit board 19, and the insulator layer 21. The substrate 16 has a sheet shape. The substrate 16 includes an upper principal surface and a lower principal surface. A length of the substrate 16 in the left-right direction is longer than a length of the substrate 16 in the front-back direction. The material of the substrate 16 is, for example, polyurethane or PET.

The bonding layer 18 fixes the piezoelectric film 14, the third electrode 15a, the second electrode 15b, the flexible printed circuit board 19, and the insulator layer 21 to the substrate 16. More specifically, the bonding layer 18 is provided on the lower principal surface of the substrate 16. The bonding layer 18 covers the entire lower principal surface of the substrate 16. Furthermore, the bonding layer 18 covers the entire upper principal surface of the insulator layer 21. The bonding layer 18 bonds the insulator layer 21 and the substrate 16. As a result, the deformation of the substrate 16 is transmitted to the piezoelectric film 14 through the bonding layer 18. The material of the bonding layer 18 is, for example, a thermosetting bonding adhesive or a thermoplastic bonding adhesive.

The bonding layer 20 is provided on the upper principal surface of the substrate 16. The bonding layer 20 fixes the substrate 16 to the lower principal surface of the plate-shaped member 7. The material of the bonding layer 20 is, for example, a thermosetting bonding adhesive or a thermoplastic bonding adhesive.

The substrate 16 and the bonding layers 18 and 20 are, for example, double-sided tapes.

Effects

According to the sensor 6, the sealing property of the first electrode 17 can be improved. More specifically, the insulator layer 21 is provided above the first electrode 17. At least a part of the outer edge E of the upper principal surface of the insulator layer as viewed in the up-down direction does not overlap the first electrode 17 as viewed in the up-down direction, and is located below the upper principal surface of the first electrode 17. Thus, the insulator layer 21 prevents moisture entering the sensor 6 from reaching the first electrode 17. Therefore, according to the sensor 6, the sealing property of the first electrode 17 can be improved.

According to the sensor 6, the sealing property of the first electrode 17 can be further improved. The entire outer edge E of the upper principal surface of the insulator layer 21 as viewed in the up-down direction does not overlap the first electrode 17 as viewed in the up-down direction, and is located below the upper principal surface of the first electrode 17. Thus, the insulator layer 21 further prevents moisture entering the sensor 6 from reaching the first electrode 17. Therefore, according to the sensor 6, the sealing property of the first electrode 17 can be further improved.

(First Modification)

Figure 4:
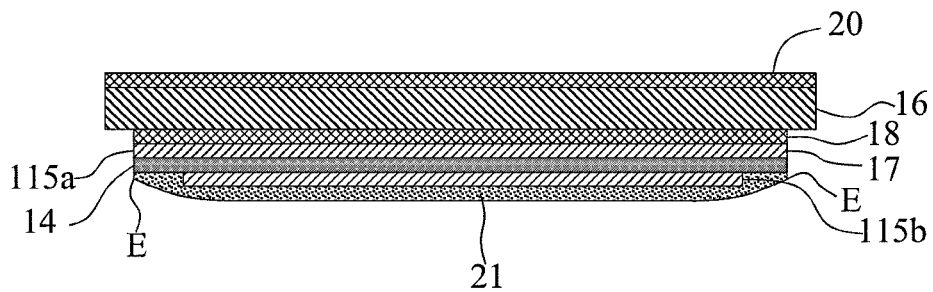
Figure 4:
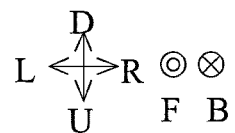

Hereinafter, a sensor 6a according to a first modification will be described with reference to the drawing. FIG. 4 is a sectional view of the sensor 6a.

The sensor 6a is different from the sensor 6 in that the up-down direction is inverted, the first electrode 17 and the flexible layers 19a and 19b are not present, and the position of the insulator layer 21. More specifically, the up-down direction of the sensor 6a is opposite to the up-down direction of the sensor 6. Therefore, in the sensor 6a, a first electrode 115b is located on a piezoelectric film 14. The first electrode 115b is connected to a ground potential. A second electrode 115a is located below the piezoelectric film 14. A detection signal is output from the second electrode 115a. An insulator layer 21 is provided on the first electrode 115b. In the present embodiment, the insulator layer 21 is provided on an upper principal surface of the first electrode 115b and an upper principal surface of the piezoelectric film 14. An entire outer edge E of the upper principal surface of the insulator layer 21 as viewed in the up-down direction does not overlap the first electrode 115b as viewed in the up-down direction, and is located below the upper principal surface of the first electrode 115b. Other structures of the sensor 6a are the same as those of the sensor 6, and thus description thereof is omitted. The sensor 6a can achieve the same actions and effect as the sensor 6.

(Second Modification)

Figure 5:
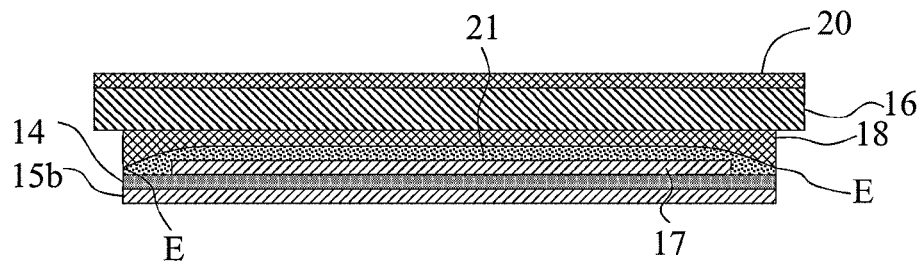
FIG. 5 is a sectional view of a sensor 6b.
Figure 5:
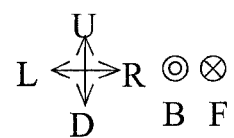

Hereinafter, a sensor 6b according to a second modification will be described with reference to the drawing. FIG. 5 is a sectional view of the sensor 6b.

The sensor 6b is different from the sensor 6 in that the third electrode 15a and the flexible layers 19a and 19b are not present, and in the position of the first electrode 17 and the position of the insulator layer 21. More specifically, a first electrode 17 is provided on an upper principal surface of a piezoelectric film 14. The first electrode 17 is a signal electrode. Therefore, a detection signal is output from the first electrode 17.

An insulator layer 21 is provided on an upper principal surface of the first electrode 17 and the upper principal surface of the piezoelectric film 14. The entire outer edge E of the upper principal surface of the insulator layer 21 as viewed in the up-down direction does not overlap the first electrode 17 as viewed in the up-down direction, and is located below the upper principal surface of the first electrode 17. Since other structures of the sensor 6b are the same as those of the sensor 6, the description thereof will be omitted. The sensor 6b can achieve the same actions and effects as the sensor 6.

Other Embodiments

The sensor according to the present disclosure is not limited to the sensors 6, 6a, and 6b, and can be changed within the scope of the gist thereof. Furthermore, the structures of the sensors 6, 6a, and 6b may be arbitrarily combined.

Note that, in the electronic device 1, the piezoelectric film 14 may be a polyvinylidene fluoride (PVDF) film. Furthermore, the piezoelectric film 14 may be piezoelectric ceramic. Furthermore, the piezoelectric film 14 may be a strain sensor.

Note that the bonding member 5 may not have waterproofness.

Note that the two sides extending in the front-back direction may be short sides, and the two sides extending in the left-right direction may be long sides.

Note that the sensor 6 may be provided at a position other than the center in the front-back direction of the plate-shaped member 7 as viewed in the up-down direction.

Note that the operation panel 2 may be a resin plate.

Note that the sensor 6 may not have a longitudinal direction extending in the left-right direction. The sensor 6 may have a longitudinal direction extending in the front-back direction.

Note that the electronic device 1 includes the touch panel, but may be a touch pad. In this case, the display panel 4 is unnecessary. Furthermore, the operation panel 2 may not be a transparent member.

Note that the outer edge E of the upper principal surface of the insulator layer 21 as viewed in the up-down direction may include a portion that does not overlap the first electrode as viewed in the up-down direction and is not located below the upper principal surface of the first electrode.

Note that the flexible printed circuit board 19 may further include a conductor layer other than the first electrode 17. The conductor layer other than the first electrode is, for example, a wiring conductor layer.

Note that the substrate 16 and the bonding layers 18 and 20 (double-sided tape) are larger than the sensor 6 as viewed in the up-down direction. However, the sensor 6 may be larger than the substrate 16 and the bonding layers 18 and 20 (double-sided tape) as viewed in the up-down direction.

Note that the substrate 16 and the bonding layer 20 are not essential constituent elements. The double-sided tape may include only the bonding layer 18.

DESCRIPTION OF REFERENCE SYMBOLS

1: Electronic device
2: Operation panel
3: Housing
4: Display panel
5: Bonding member
6, 6a, 6b: Sensor
7: Plate-shaped member
14: Piezoelectric film
15a: Third electrode
15b, 115a: Second electrode
16: Substrate
17, 115b: First electrode
18: Bonding layer
19: Flexible printed circuit board
19a, 19b: Flexible layer
20: Bonding layer
21: Insulator layer
E: Outer edge

The invention claimed is:

1. A sensor comprising:
a piezoelectric film including an upper principal surface and a lower principal surface aligned in an up-down direction;
a first electrode including an upper principal surface and a lower principal surface aligned in the up-down direction, arranged above the piezoelectric film, and overlapping at least a part of the piezoelectric film as viewed in the up-down direction;
a second electrode including an upper principal surface and a lower principal surface aligned in the up-down direction, arranged below the piezoelectric film, and overlapping at least a part of the piezoelectric film as viewed in the up-down direction; and
an insulator layer including an upper principal surface and a lower principal surface aligned in the up-down direction, arranged above the first electrode, and overlapping at least a part of the first electrode as viewed in the up-down direction, wherein at least a part of an outer edge of the upper principal surface of the insulator layer as viewed in the up-down direction does not overlap the first electrode as viewed in the up-down direction, and is located below the upper principal surface of the first electrode as viewed in the up-down direction.

2. The sensor according to claim 1, wherein an entirety of the outer edge of the upper principal surface of the insulator layer as viewed in the up-down direction does not overlap the first electrode as viewed in the up-down direction, and is located below the upper principal surface of the first electrode.

3. The sensor according to claim 1, further comprising a third electrode including an upper principal surface and a lower principal surface aligned in the up-down direction, arranged above the piezoelectric film and below the first electrode, and overlapping at least a part of the piezoelectric film as viewed in the up-down direction,
wherein the second electrode is connected to a ground potential, and
the third electrode is constructed to output a detection signal.

4. The sensor according to claim 1, wherein
the first electrode is connected to a ground potential, and
the second electrode is constructed to output a detection signal.

5. The sensor according to claim 1, wherein a polarity of a charge generated by the piezoelectric film when the piezoelectric film is stretched in a left-right direction is different from a polarity of a charge generated by the piezoelectric film when the piezoelectric film is stretched in a front-back direction.

6. The sensor according to claim 1, wherein the piezoelectric film comprises polylactic acid.

7. The sensor according to claim 1, wherein the insulator layer overlaps an entirety of the first electrode as viewed in the up-down direction.

8. The sensor according to claim 1, wherein a material of the insulator layer is polyimide.

9. The sensor according to claim 1, wherein the insulator layer is on the upper principal surface of the first electrode and the upper principal surface of the piezoelectric film.

10. The sensor according to claim 9, wherein an entirety of the outer edge of the upper principal surface of the insulator layer as viewed in the up-down direction does not overlap the first electrode as viewed in the up-down direction, and is located below the upper principal surface of the first electrode.

11. The sensor according to claim 1, further comprising a substrate on the upper principal surface of the insulator layer.

12. The sensor according to claim 1, further comprising a substrate on the lower principal surface of the first electrode.

13. An electronic device comprising:
an operation panel; and
the sensor according to claim 1 fixed to the operation panel so as to detect deformation of the operation panel.

14. The electronic device according to claim 13, further comprising a display panel between the operation panel and the sensor.

15. The electronic device according to claim 14, further comprising a plate-shaped member between the display panel and the sensor.

16. The electronic device according to claim 13, wherein the sensor is located at a center of the operation panel.

* * * * *